US010770967B2

United States Patent
Walker

(10) Patent No.: US 10,770,967 B2
(45) Date of Patent: Sep. 8, 2020

(54) PREDICTIVE POWER FACTOR CONTROL FOR ELECTRONIC SYSTEMS

(71) Applicant: HEWLETT PACKARD ENTERPRISE DEVELOPMENT LP, Houston, TX (US)

(72) Inventor: William J. Walker, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 33 days.

(21) Appl. No.: 16/185,060

(22) Filed: Nov. 9, 2018

(65) Prior Publication Data

US 2020/0153329 A1   May 14, 2020

(51) Int. Cl.
*H02M 1/42* (2007.01)
*H05K 7/20* (2006.01)

(52) U.S. Cl.
CPC .......... *H02M 1/42* (2013.01); *H05K 7/20909* (2013.01); *H05K 7/20945* (2013.01)

(58) Field of Classification Search
CPC .. H02M 1/42; H05K 7/20909; H05K 7/20945
USPC ......................................................... 307/31
See application file for complete search history.

(56) References Cited

U.S. PATENT DOCUMENTS

| 8,845,485 B2 * | 9/2014 | Smithson | B60H 1/3222 |
| | | | 477/42 |
| 2013/0049471 A1 * | 2/2013 | Oleynik | H02J 9/062 |
| | | | 307/65 |

* cited by examiner

*Primary Examiner* — Michael R. Fin
(74) *Attorney, Agent, or Firm* — Nolte Intellectual Property Law Group

(57) ABSTRACT

A predictive power factor control system for an electronic system which includes a power supply providing power at a power supply output to a load having at least one component operable in a plurality of operating states. A load controller selectively determines the operating state of the load. A power factor control (PFC) circuit is coupled to the power supply and cooperates with the power supply to maintain the power factor of the power supply output within desired ranges. The load controller may provide the PFC circuit with a pending load change notification prior to a pending change in the operating state of the controlled load or prior to the activation of additional loads on the power supply output, enabling the PFC circuit to predictively adjust operation to avoid or minimize power factor fluctuations arising from changes in operating state of the load or activation of an additional loads.

17 Claims, 5 Drawing Sheets

PREDICTIVE POWER FACTOR CONTROL FOR ELECTRONIC SYSTEMS

BACKGROUND

Many electronic systems having operational electronic components receiving power from a power supply are known, including many computing systems such as computers and the like having electronic circuitry in the form of microprocessors, memory systems, and related circuitry. In some cases, the electronic components may be sensitive to fluctuations in the operation power supplied to them from a power supply. Consequently, power supplies may incorporate regulation circuitry to maintain a consistent power supply output under variable conditions.

One approach to power supply regulation involves power factor control (PFC) circuitry to compensate for variations between real power and apparent power delivered by a power supply depending upon the presence of reactive loads (inductive or capacitive) coupled to the power supply output. PFC circuitry can adjust the power supply output to maintain the power factor and other conditions of a power supply output within desired ranges and thus limit the effects of highly reactive loads placed on a power supply.

BRIEF DESCRIPTION OF THE DRAWINGS

For a detailed description of various examples, reference will be made to the accompanying drawings, in which.

DETAILED DESCRIPTION

Figure 1:
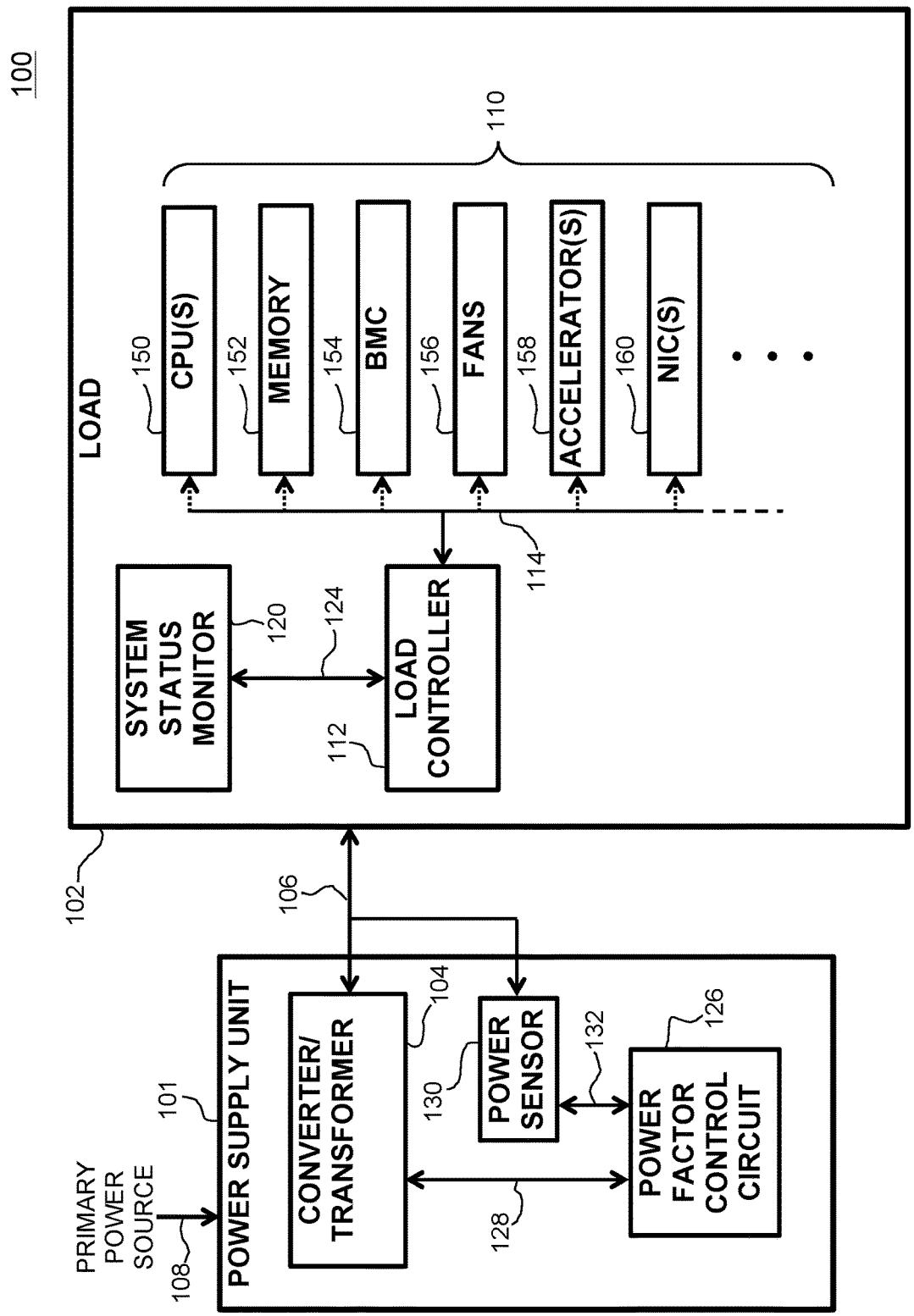
FIG. 1 is a block diagram of an electronic system.

While PFC circuitry can adjust the power supply output to limit the effects of reactive (i.e., capacitive or inductive) loads on the conditions of a power supply output, in a typical implementation, such adjustment occurs in a responsive manner. PFC circuitry may be incorporated to greater or lesser degrees into a power supply, such that the PFC circuitry cooperates with the power supply to compensate for detected fluctuations in the power supply's output, such as by selectively introducing a passive network of capacitors or inductors into the output circuit. If PFC circuitry depends on or incorporates sensing circuitry coupled to the power supply output in order to detect fluctuations, the PFC's compensating response may be delayed to some degree depending upon the sensitivity of such sensing circuitry and the time that may be required between detection of fluctuations in power supply output and the activation of the PFC circuitry to compensate for such fluctuations. There are some circumstances, however, where fluctuations in a power supply's output may be predictable. A purely responsive PFC implementation does not capitalize on such predictability.

As an alternative to a purely responsive approach to power factor control, examples disclosed herein utilize a predictive approach, whereby a PFC circuit is operated predictively based upon prior notification of pending events expected to cause fluctuations in a power supply output, such as the change in operating state of a variable load operable in a plurality of operating states. For example, a controller that knows that the load of the power supply is about to change and/or may be the initiator of such a change, may notify a PFC circuit about the pending change in load. In response, the PFC circuit may adjust the power factor correction it applies to predictively compensate for the change in the load. For example, if cooling fans of a server are going to change their operating state by increasing their speed, (thus changing the character of their power consumption), a controller of the fans, such as a baseboard management controller (BMC), can notify the PFC circuit of the pending change and the PFC can begin to compensate for the change in load. Such predictive behavior is advantageous in that the inherent response time associated with detection of a power supply fluctuation, adjustment of circuitry to compensate for the fluctuation, and the stabilization time following an adjustment, can be avoided.

The term "electronic system" is intended to refer to any arrangement of electronic components requiring power from a power supply. Examples include, without limitation, computers and computing systems of various kinds, which may include microprocessors, memory devices, and related components. A computer may include numerous electronic components arranged and disposed on a printed circuit board (PCB), and often a computer may include numerous PCBs, such as a main "motherboard including a microprocessor, and other PCBs or modules containing memory or other operational elements. Typically, a power supply is provided which is connected to a primary power source, such as conventional AC power provided by a power utility, and which may transform and deliver the power to the electronic components to which the power supply is coupled. For example, a power supply may receive AC power from a utility, perform an AC-to-DC conversion of the AC power, and produce a DC supply signal at an output coupled to power connections of the various electronic components. A single power supply may distribute power to multiple electronic components.

Many electronic components are sensitive to fluctuations in the power provided by a power supply. The ever-decreasing feature size of state-of-the-art semiconductor devices makes such devices increasingly susceptible to fluctuations in operational power. In recognition of this, many power supplies include regulation circuitry to condition or otherwise regulate the output of the power supply to ensure a highly stable power signal supplied to powered devices.

As noted, one type of power regulation is referred to as power factor control (PFC). The term "power factor" refers to the ratio of real power delivered to a load and the apparent power delivered to the load by a power supply, in a power supply and load circuit. Power factor is a dimensionless number ranging between negative one and one. A power factor of less than one means that the voltage and current waveforms are not in phase, reducing the instantaneous power (voltage times current), and thus reducing the overall power efficiency of the system. Due to energy stored in the load and returned to the source, or due to non-linear loads that distort the wave shape of the current drawn from the source, the apparent power can be greater than the real power. A greater difference between real power and apparent power in a system reflects undesirable power transfer inefficiency.

Being a function of the power in a system, the power factor of a power signal reflects the current magnitude, voltage magnitude, and current/voltage phase angle of a power signal. An adjustment in the power factor of a power signal may involve adjustment of the power signal's current, voltage, phase angle, or some combination thereof.

Loads which are reactive (i.e., inductive or capacitive) can adversely impact the power factor in an electronic system, thereby reducing the overall power transfer efficiency of the system. Moreover, loads which have reactive components that are variable during operation can cause undesirable fluctuations in the power supplied to other sensitive electronic components receiving power from a power supply. PFC circuitry associated with a power supply may be provided to compensate for variations between real power and apparent power delivered by a power supply depending upon the presence of reactive loads coupled to the power supply output. PFC circuitry can cooperate with the power supply output to limit the effects of appreciably reactive loads coupled to a power supply output.

Various implementations and configurations of PFC circuitry are known. Commonly, a PFC circuit operates in response to detected power factor fluctuations, such as detected voltage level or current level fluctuations, and/or detected fluctuations in the phase angle difference between current and voltage at the output of the power supply. A PFC circuit typically cooperates with a power supply to selectively introduce capacitive and/or inductive elements into the power supply circuitry, or to employ other electrical methodologies, in response to power supply output fluctuations that occur, to achieve desired compensatory effects, such as adjusting the current/voltage phase angle of the power supply output.

For electronic systems which include variable loads, i.e., loads whose reactive components of the load may depending upon their operating states, a PFC circuit may be adaptive. An adaptive PFC circuit may cooperate with a power supply dynamically and continuously to compensate for power factor fluctuations due to changes in the operating states of variable loads. In some implementations, however, a PFC circuit operates only responsively, and becomes operative only upon the occurrence and detection of fluctuations requiring compensation. In such implementations, there may be a non-instantaneous response between the time a power factor fluctuation occurs and when the fluctuation is detected and the PFC circuitry can be adjusted to compensate for the detected fluctuation. Moreover, once the PFC circuitry is adjusted, there may be a stabilization period before operation of the PFC circuitry fully compensates for a power factor fluctuation caused by a variation in reactive components of the load.

Turning to the figures, FIG. 1 shows a block diagram of an electronic system 100 including a load 102 and a power supply unit 101 providing power to load 102 via a power supply output 106. In this example, load 102 may include a plurality of electronic devices and systems, including, without limitation, one or more processing units (CPUs) 150, memory devices and modules 152, baseboard management controller (BMC) circuitry 154, cooling system components including one or more cooling fans 156, one or more processor accelerators 158, network interface systems including one or more network interface controllers (NICs) 160, as well as other devices (not specifically shown in FIG. 1, such as add-on peripheral devices, storage devise, and so on), in any combination. The various components of load 102 are collectively identified with reference numeral 110 in FIG. 1. Some load components 110 may be considered variable load components, due to their ability to operate in a plurality of operating states. For example, cooling fans 156 may be variable load components due to their capability to operate at multiple different speeds; operating at different speeds may cause fans 156 to place different loads upon a power supply unit. Similarly, CPUs 150 may be variable load components due to their different power consumption profiles depending upon processing load at any given time.

In the example of FIG. 1, power supply unit 101 may receive power from a primary power source 108 and transform, convert or otherwise condition primary power source 108 via a converter/transformer 104 to provide power supply output 106. Converter/transformer 104 may be or include an alternating current to direct current converter (AC to DC converter) for transforming AC power from primary power source 108 to DC power supplied at power supply output 106 and distributed to components of electronic system 100.

In the example 100 of FIG. 1, power supply output 106 is coupled to and provides power to the various components 110 of load 102. Each component 110 of load 102 constitutes a component of the total load 102 on power supply unit 101. In this example, one or more components 110 of load 102 may be variable loads operable in more than one operating state, including, such as, an "on" state and an "off" state, or an "off" state and a plurality of distinct "on" states which may exhibit correspondingly distinct power usage profiles and thus potentially representing variable loads being placed on power supply unit 101. The operating state of one or more components 110 of load 102 may be selected by a load controller 112, which may be coupled to various components 110 of load 102 via a connection 114, which may include one or more control signal lines. Changes in the operating state of any component 110 of load 102 may cause overall variations in the reactive components of load 102.

Although only a single load controller 112 is shown in FIG. 1, in various implementations certain components 110 of load 102 may incorporate or otherwise be associated with separate load controllers 112. Although shown as separate blocks in FIG. 1, the load controller 112 may be implemented in or be a part of one or more of the other components 110. Load controller 112 in FIG. 1 is intended to be representative of load controlling functions generally.

In the example of FIG. 1, load 102 includes cooling fans 156 for providing heat-dissipating air flow to maintain desired thermal conditions for operation of the various load components 110. Load controller 112 may provide control signals over connection 114 to control such fans 156 to selectively control the operating state of fans 156. For example, fans 156 may be operable at one or more operating speeds and thus may have a plurality of "on" operating states, and may place more or less of a load on power supply unit 101 depending on their operating speed. As noted above, certain components 110 of load 102 may include or be associated with separate load controllers and thus have separate connections to the respective load components 110. Moreover, one or more load components 110 may be provided to perform power management and other load control operations of their own. Baseboard management controller (BMC) 154 is one example of a component 110 which may operate to provide load control information as described herein.

In this example, a system status monitor 120 may comprise one or more temperature sensors for monitoring thermal conditions of load components 110 of load 102. Similarly, system status monitor 120 may receive notifications from other components 110 of load 102 when it becomes necessary for such components 110 to adjust their operating state(s), potentially impacting the overall load placed on power supply unit 101. One or more CPUs 150, for example, may undergo periods of high computational load, causing them to draw increased power from power supply unit 101 for certain periods of time. The various physical and/or logical connection(s) necessary for system status monitor 120 to obtain system status information from the various components 110 of load 102, such as one or more temperature readings is not specifically shown in FIG. 1.

In this example, system status monitor 120 may communicate system status information to load controller 112 via a connection 124. For example, system status monitor 120 may provide numeric temperature data over connection 124 to load controller 112, providing load controller 112 with information to determine appropriate operating states for cooling fans 156 at any given time.

In the case of fans 156, in response to temperature data provided from system status monitor 120, load controller 112 may be operable to adjust the operating state of cooling fans 156. For example, cooling fans 156 may have a plurality of operating states including an "off" state, and a plurality of "on" states corresponding to a range of fan speeds. Load controller 112 may respond to higher temperature readings received from system status monitor 120 to select higher operating speeds for cooling fans 156, while lower temperature readings may cause load controller 112 to select lower speeds for cooling fans 156.

Electronic system 100 of FIG. 1 further includes a power factor control (PFC) circuit 126 coupled to converter/transformer 104 by a connection 128.

Although converter/transformer 104 and PFC circuit 126 are represented as separate functional blocks in FIG. 1, it is to be understood that some or all of the functionality of these two blocks may be combined; connection 128 in FIG. 1 represents any number of connections between converter/transformer 104 and PFC circuit 126, such that in a particular implementation, the distinction between converter/transformer 104 and PFC circuit 126 may not be as clearly delineated as is depicted in FIG. 1. The functional blocks are shown as such in FIG. 1 to serve as the basis for a description of the functionality of electronic system 100 as a whole.

A power sensor 130 is coupled to power supply output 106 and is adapted to sense and monitor one or more parameters of power supply output 106. For example, power sensor 130 may monitor the voltage and current levels of power supply output 106, and may derive information about the power factor of power supply output 106, i.e., the phase angle between voltage and current at the power supply output 106 of power supply unit 101.

Power sensor 130 may communicate with PFC circuit 126 via a feedback connection 132 to adjust operation of PFC circuit 126 to compensate for fluctuations and other undesirable conditions on power supply output 106, such as voltage, current, and/or power factor levels outside of desired ranges.

As described above, system status monitor 120 may provide control signals to load controller 112 which cause load controller 112 to initiate adjustment of the operating state(s) of one or more load components 110, such as, for example, the operating speeds of cooling fans 156. Appropriate adjustment commands or signals are communicated to load components 110, as necessary, via connection 114

In this scenario, upon a change in the operating state of a load component 110, such as an increase in cooling fan speed or increased demand on CPUs 150, the reactive components of the load placed upon power supply output 106 may change, perhaps sharply (at least initially). This change in load on power supply unit 101 can adversely affect conditions of power supply output 106, including the power factor of the power signal it provides. This is especially true when a load component 110 is substantially reactive, as can be the case with cooling fans 156, which can be highly inductive loads.

A resulting fluctuation in power supply output 106 may be detected by power sensor 130, which may then communicate with PFC circuit 126 to adjust PFC circuit 126 to compensate for the detected fluctuation of power supply output 106. In this way, the power efficiency of power supply unit 101 may be improved. However, the power efficiency for power supply unit 101 may be less than optimal in the foregoing scenario, since the adjustment of PFC circuit 126 may not happen instantaneously with change of operating state of controlled load a component 110 of load 102. Instead, it may take some of time for a fluctuation in power supply output 106 to occur and to be detected by power sensor 130, and for PFC circuit 126 to be adjusted appropriately and begin compensating for the detected fluctuation. There may also be a stabilization period after adjustment of PFC circuit 126 before complete or desired compensation for a fluctuation is realized.

Figure 2:
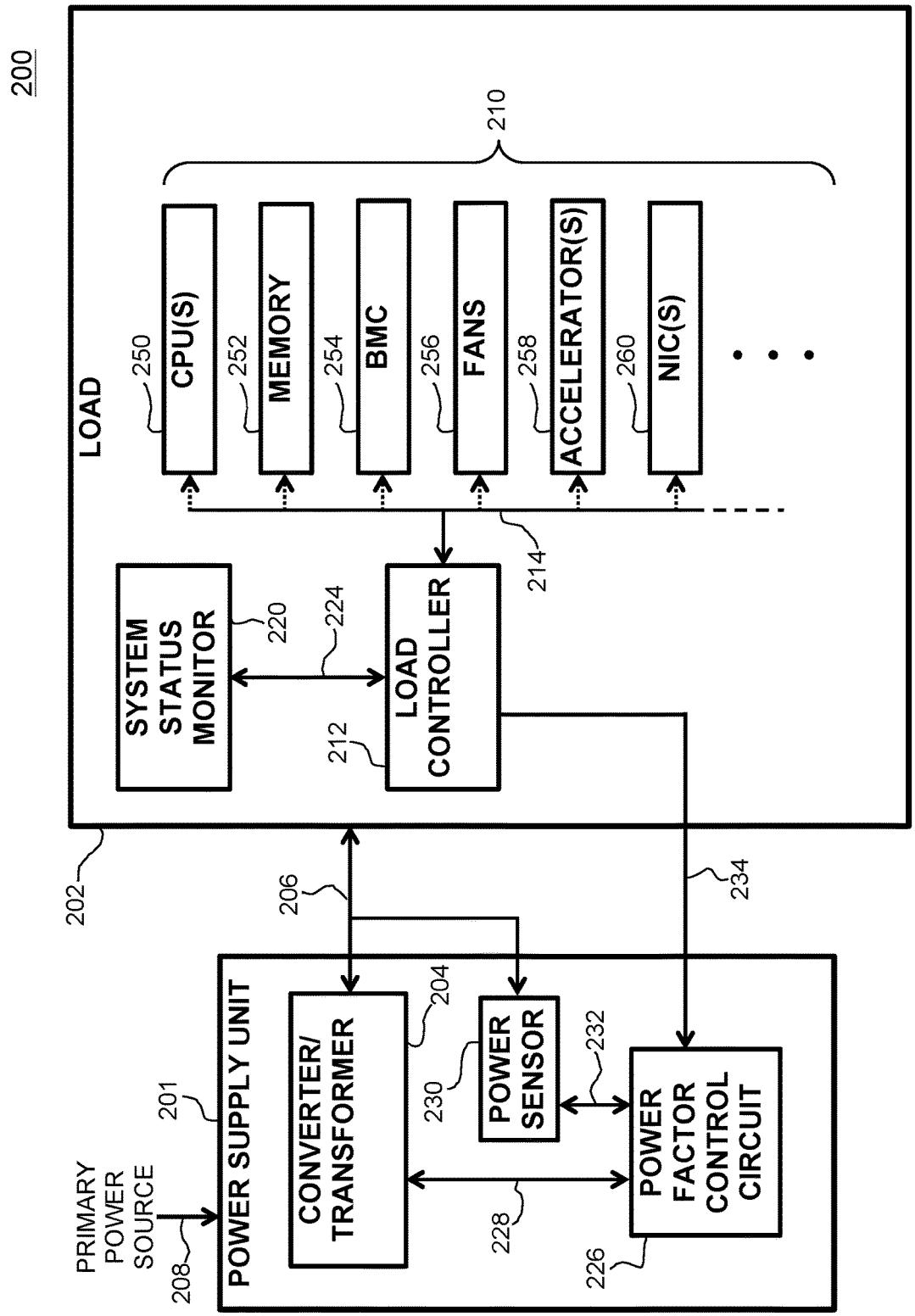
FIG. 2 is a block diagram of an alternative example electronic system.

Referring to FIG. 2, there is shown a block diagram of an example of another electronic system 200 including a load 202 and a power supply unit 201 providing power to load 202 via a power supply output 206. As in the example of FIG. 1, load 202 may include a plurality of electronic devices and systems, including, without limitation, one or more processing units (CPUs) 250, memory devices and modules 252, baseboard management controller (BMC) circuitry 254, cooling system components including one or more cooling fans 256, one or more processor accelerators 258, network interface systems including one or more network interface controllers (NICs) 260, as well as other devices (not specifically shown in FIG. 2, such as add-on peripheral devices, storage devise, and so on, in any combination. The various constituent components of load 202 are collectively identified with reference numeral 210 in FIG. 2. Some load components 202 may be considered variable load components, due to their ability to operate in a plurality of operating states. For example, cooling fans 256 may be variable load components due to their capability to operate at multiple different speeds; operating at different speeds may cause fans 256 to place different loads upon a power supply unit. Similarly, CPUs 250 may be variable load components due to their different power consumption profiles depending upon processing load at any given time.

In the example of FIG. 2, power supply unit 201 may receive power from a primary power source 208 and transform, convert or otherwise condition primary power source 208 via a converter/transformer 204 to provide power supply output 206. Power converter/transformer 204 may be or include an alternating current to direct current converter (AC to DC converter) for transforming AC power from primary power source 208 to DC power supplied at power supply output 206 and distributed to components of electronic system 200.

In the example 200 of FIG. 2, power supply output 206 is coupled to and provides power to the various components of load 202. Each component 210 of load 202 constitutes a component of the total load 202 on power supply unit 201. In this example, one or more components 210 of load 202 may be variable loads operable in more than one operating state, including, such as, an "on" state and an "off" state, or an "off" state and a plurality of distinct "on" states which may exhibit correspondingly distinct power usage profiles and thus potentially representing variable loads being placed on power supply unit 201. The operating state of one or more components 210 of load 202 may be selected by a load controller 212, which may be coupled to various components 210 of load 202 via a connection 214, which may include one or more control signal lines. Changes in the operating state of any component 210 of load 202 may cause overall variations in the reactive components of load 202.

Although only a single load controller 212 is shown in FIG. 2, in various implementations certain components 210 of load 202 may incorporate or otherwise be associated with separate load controllers. Load controller 212 in FIG. 2 is intended to be representative of load controlling functions generally.

In the example of FIG. 2, load 202 includes cooling fans 256 for providing heat-dissipating air flow to maintain desired thermal conditions for operation of the various load components 210. Load controller 212 may provide control signals over connection 214 to control such fans 256 to selectively control the operating state of fans 256. For example, fans 256 may be operable at one or more operating speeds and thus may have a plurality of "on" operating states, and may place more or less of a load on power supply unit 201 depending on their operating speed. As noted above, certain components 210 of load 202 may include or be associated with separate load controllers and thus have separate connections to the respective load components 210. Moreover, one or more load components 210 may be provided to perform power management and other load control operations of their own. Baseboard management controller (BMC) 254 is one example of a component 210 which may operate to provide load control information as described herein.

In this example, a system status monitor 220 may comprise one or more temperature sensors for monitoring thermal conditions of load components 210 of load 202. Similarly, system status monitor 220 may receive notifications from other components 210 of load 202 when it becomes necessary for such components 210 to adjust their operating state(s), potentially impacting the overall load placed on power supply unit 201. One or more CPUs 250, for example, may undergo periods of high computational load, causing them to draw increased power from power supply unit 201 for certain periods of time. The various physical and/or logical connection(s) necessary for system status monitor 220 to obtain system status information from the various components 210 of load 202, such as one or more temperature readings is not specifically shown in FIG. 2.

In this example, system status monitor 220 may communicate system status information to load controller 212 via a connection 224. For example, system status monitor 220 may provide numeric temperature data over connection 224 to load controller 212, providing load controller 212 with information to determine appropriate operating states for cooling fans 256 at any given time.

In the case of fans 256, in response to temperature data provided from system status monitor 220, load controller 212 may be operable to adjust the operating state of cooling fans 256. For example, cooling fans 256 may have a plurality of operating states including an "off" state, and a plurality of "on" states corresponding to a range of fan speeds. Load controller 212 may respond to higher temperature readings received from system status monitor 220 to select higher operating speeds for cooling fans 156, while lower temperature readings may cause load controller 212 to select lower speeds for cooling fans 256.

Electronic system 200 of FIG. 2 further includes a power factor control (PFC) circuit 226 coupled to converter/transformer 204 by a connection 228.

Although converter/transformer 204 and PFC circuit 226 are represented as separate functional blocks in FIG. 2, it is to be understood that some or all of the functionality of these two blocks may be combined; connection 228 in FIG. 2 represents any number of connections between converter/transformer 204 and PFC circuit 226, such that in a particular implementation, the distinction between converter/transformer 204 and PFC circuit 226 may not be as clearly delineated as is depicted in FIG. 2. The functional blocks are shown as such in FIG. 2 to serve as the basis for a description of the functionality of electronic system 200 as a whole.

A power sensor 230 is coupled to power supply output 206 and is adapted to sense and monitor one or more parameters of power supply output 206. For example, power sensor 230 may monitor the voltage and current levels of power supply output 206, and may derive information about the power factor of power supply output 206, i.e., the phase angle between voltage and current at the power supply output 206 of power supply 204.

Power sensor 230 may communicate with PFC circuit 226 via a feedback connection 232 to adjust operation of PFC circuit 226 to compensate for fluctuations and other undesirable conditions on power supply output 206, such as voltage, current, and/or power factor levels outside of desired ranges.

As described above, system status monitor 220 may provide control signals to load controller 212 which cause load controller 212 to initiate adjustment of the operating state(s) of one or more load components 210, such as, for example, the operating speeds of cooling fans 256. Appropriate adjustment commands or signals are communicated to load components 210, as necessary, via connection 214

In this scenario, upon a change in the operating state of a load component 210, such as an increase in cooling fan speed or increased demand on CPUs 250, the reactive components of the load placed upon power supply output 206 may change, perhaps sharply (at least initially). This change in load on power supply unit 201 can adversely affect conditions of power supply output 206, including the power factor of the power signal it provides. This is especially true when a load component 210 is substantially reactive, as can be the case with cooling fans 256, which can be highly inductive loads.

A resulting fluctuation in power supply output 206 may be detected by power sensor 230, which may then communicate with PFC circuit 226 to adjust PFC circuit 226 to compensate for the detected fluctuation of power supply output 206. In this way, the power efficiency of power supply unit 201 may be improved. However, the power efficiency for power supply unit 201 may be less than optimal in the foregoing scenario, since the adjustment of PFC circuit 226 may not happen instantaneously with change of operating state of a component 210 of load 202. Instead, it may take some of time for a fluctuation in power supply output 206 to occur and to be detected by power sensor 230, and for PFC circuit 226 to be adjusted appropriately and begin compensating for the detected fluctuation. There may also be a stabilization period after adjustment of PFC circuit 226 before complete or desired compensation for a fluctuation is realized.

In the example electronic system 200 of FIG. 2, load controller 212 communicates with PFC circuit 226 via a connection 234. In this example, load controller 212 is operable to provide a pending load change notification to PFC circuit 226 in advance of changing the operating state of any component 110 of load 102, i.e., prior to causing the load placed on power supply 204 from changing due to a change in the operating state of load 202.

In this example, load controller 212 may be implemented as a microprocessor, microcontroller, application-specific integrated circuit or the like, enabling it to achieve the functionality as described herein, including communicating information over connection 234. For example, load controller 212 may communicate timing information as part of the pending load change notification described above, such that PFC circuit 226 may respond in an appropriate timed relation to a change in operating state of a component 210 of load 202 initiated by load controller 212. In one scenario, for example, a job scheduler may notify load controller 212 of a pending change in processing load of CPU(s) 250 (or, in some examples, the job scheduler may itself be one of the load controllers 212), thereby enabling load controller 212 to initiate a predictive adjustment of PFC circuit 226 to compensate for the associated load increase.

In this example, advance notifications of changes to the operating state(s) of load components 210 allow PFC circuit 226 to be adjusted to predictively compensate for changes in the load on power supply 204, thereby advantageously avoiding fluctuations in power supply output 206, including avoiding delay between the occurrence and detection of such fluctuations and the activation/adjustment of PFC circuit 226 to compensate for those fluctuations.

Advance notifications of changes in operating state(s) of load components 210 may advantageously include information about the anticipated effect that such changes will have on operation of power supply unit 201. For example, advance notifications provided to PFC circuit 226 may indicate not only anticipated timing of the pending change(s), but also indicate that, for example, the change is likely to increase the inductive (or capacitive) component of load 202. The anticipated extent of such change(s) may also be indicated. For example, the notification may indicate an amount by which the phase difference is anticipated change and a timing predicted for the change. Individual components 210 of load 202 may provide information to load controller 212 from which the load controller 212 may determine the information to include in the notification.

In some examples, the load controller 212 may associate (e.g., in a table) certain changes in operational state of certain load components 210 with corresponding effects on the power factor, prior to load controller 212 providing advance notification of pending load changes to PFC circuit 226 as described herein. Then, when the controller 212 determines that a change in operational state of a particular component is going to occur, it may determine an estimate of the effect that change will have on the power factor by looking up the effect that is associated with the anticipated change in operational state.

In some examples, the associations between changes in operational state of load components 210 and effects on power factor may be determined by the load controller 212 based on observations of actual operation of the system. In other words, the load controller 212 may "learn" how changes in operational states of certain components 210 affect the power factor by observing actual instances of such changes and their effect on the power factor. For example, the PFC circuit 226 may notify the load controller 212 of the amount of corrections it is making to the power factor (e.g., a magnitude of the phase difference), and the load controller 212 may correlate changes in the amount of correction with changes in operational states of components 210. For example, if it is observed that the load of a particular component 210 increases by a particular amount and shortly thereafter the phase difference increases by a particular amount, the controller 212 may associate the increase in phase difference with the increase in load for the particular component 210. In some examples, the associations between changes in operational states and changes in power factor may be updated dynamically. For example, the load controller 212 may keep track of multiple instances of the same event and the resulting effects on power factor, and may determine a statistical aggregation (such as an average) of the effect on power factor that may be used by the controller 212 in generating the notification.

The terms "predictive" and "predictively" as used herein refer to the ability of a functional component to perform an operation in advance of a pending event. Such "predictive" operation may be facilitated by one functional component providing advance notifications of pending events to another functional component, such as by load controller 212 communicating to PFC circuit 226 a pending load change notification reflecting a pending change in the operating state of controlled load 210 to be initiated by load controller 212. As noted, such advance notifications may include information about pending events, such as timing information enabling a responding functional component to perform an appropriately-timed predictive operation.

Figure 3:
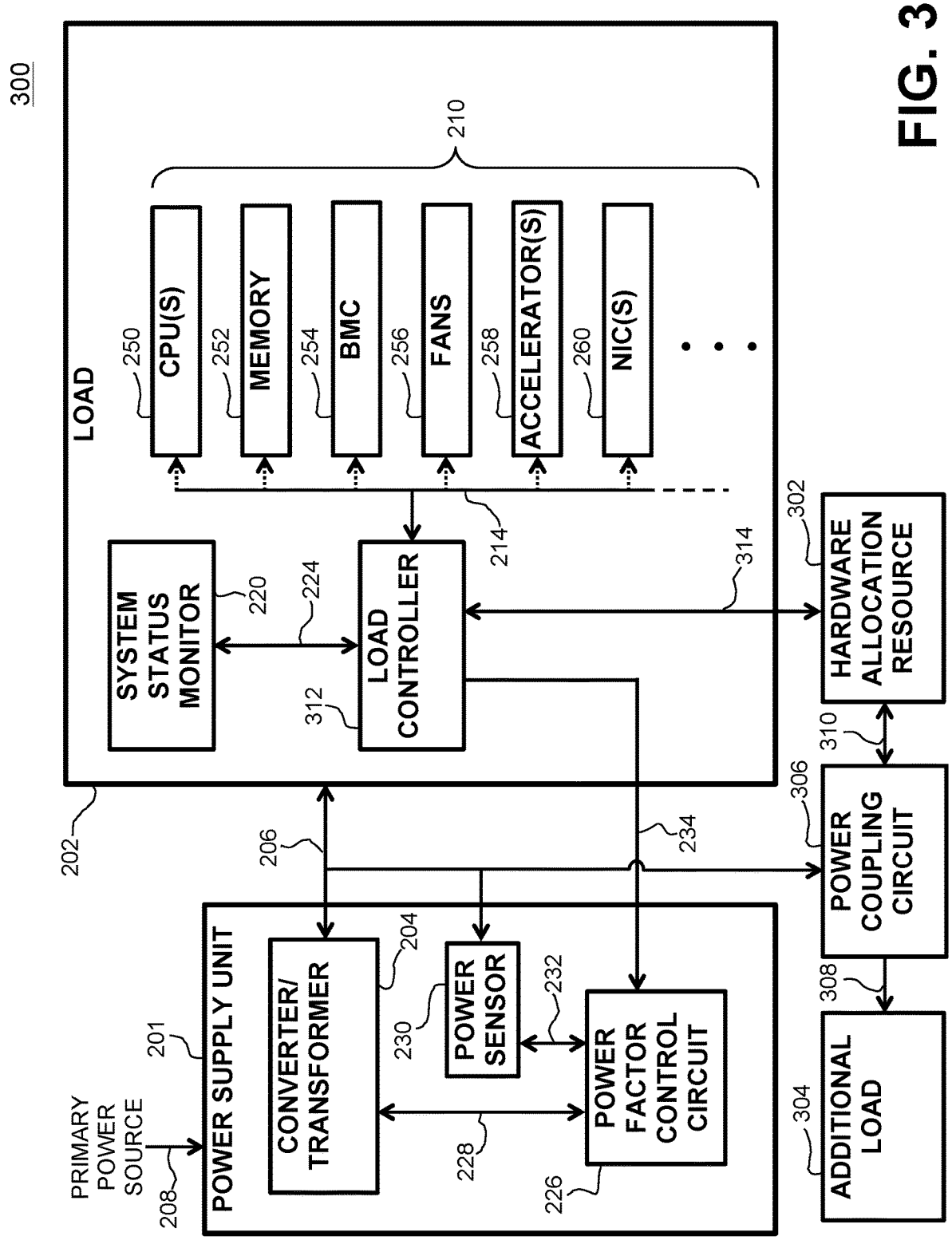
FIG. 3 is a block diagram of another alternative example electronic system.

In FIG. 3, there is shown a block diagram of an example of another electronic system 300. In FIG. 3, those elements which are substantially the same as those from the example of FIG. 2 have retained identical reference numerals and are to be understood to operate substantially in accordance with the foregoing description relating to FIG. 2. In FIG. 3, the electronic system 300 includes a hardware allocation resource 302 operable to selectively introduce additional electronic components into electronic system 300. Such additional components are represented as additional load 304 in FIG. 3. A power coupling circuit 306 is coupled to power supply output 206 and is operable to selectively couple additional load 304 to power supply output 206 via power connection 308. Power coupling circuit 306 is responsive to one or more signals on a connection 310 with hardware allocation resource 302 to selectively activate additional load 304 by completing a connection between power supply output 206 and additional load 304 via power connection 308.

As shown in FIG. 3, when additional load 304 is coupled to power supply output 206 through power coupling circuit 306 and connection 308, additional load 304 is placed on power supply unit 201, potentially causing a fluctuation in power supply output 206. Additional load 304 may include one or a plurality of additional load components, such as additional computing systems, microprocessors, memory devices, and/or other electronic components. Hardware allocation resource 302 may be implemented as a network configuration server or the like operable to dynamically reconfigure hardware resources in a network.

To avoid or minimize fluctuation on power supply output 206 due to selective coupling of additional load 304 to power supply output 206, hardware allocation resource 302 may be coupled to a load controller 312 via power connection 314. In an implementation where hardware allocation resource 302 comprises a network configuration server, connection 314 between hardware allocation resource 302 and load controller 312, as well as connection 310 between hardware allocation resource 302 and power coupling circuit 306, may be network connections.

Load controller 312 in FIG. 3 provides substantially the same functionality as load controller 212 from FIG. 2, and is further operable to communicate with hardware allocation resource 302 by connection 314. Through connection 314, hardware allocation resource 302 may provide a pending load change notification to load controller 312 in advance of additional load 304 being coupled to power supply output 206. By providing such a pending load change notification, load controller 312 may communicate via connection 234 with PFC circuit 226 to initiate predictive compensation for the activation of additional load 304. Thus, when additional load 304 is coupled through power coupling circuit 306 to power supply output 206 under control of hardware allocation resource 302, fluctuations in power supply output 206 may be minimized through elimination of the above-described response time which may otherwise elapse between occurrence and detection of a fluctuation in power supply output 206 and the appropriate adjustment to PFC circuit 226.

Although a single additional load 304 is shown in FIG. 3, it will be appreciated that hardware allocation resource 302 may operate as described herein to similarly effectuate activation of any number of additional loads drawing on power supply unit 201, power coupling circuit 306 may be implemented to accommodate such additional loads, and additional power coupling circuits (not shown) with functionality corresponding to power coupling circuit 306 may be provided.

In the examples described herein, various functional components are capable of communicating with one another according to the various connections shown. Depending upon the implementation of various functional components, such communication may be accomplished in a variety of ways. In some cases, such as implementations of system status monitors (functional block 120 in the example of FIG. 1, functional block 220 in the example of FIGS. 2 and 3) and load controllers (functional block 112 in FIG. 1, functional block 212 in the example of FIG. 2, and functional block 312 in the example of FIG. 3), as well as hardware allocation resource 302 in the example of FIG. 3, these functional blocks may represent circuits or subsystems including microprocessors and/or microcontrollers. Communication between these functional blocks may utilize serial links, for example, the Inter-Integrated Circuit (I²C) serial bus and related protocol, to accomplish the necessary communication. Advantageously, the implementation of a serial link, such as an I²C communication link between components of electronic systems 200 or 300 can facilitate the incorporation of information about pending load changes (i.e., information about whether a pending load change is anticipated to increase either capacitive or inductive load on a power supply unit, the anticipated magnitude of the load change(s), the anticipated timing of the load changes, and so on) in the advance notifications of pending load changes described herein.

In the electronic system 300 of FIG. 3, as previously noted, hardware allocation resource 302 may be implemented as a network configuration server, and connections such as connection 314 between hardware allocation resource 302 and other functional components such as load controller 312 may be implemented as network connections, such that hardware allocation resource 302 may be located remotely from other components of system 300. Also, in FIG. 3, power supply unit 201 may provide power to equipment such as one or more high-performance computing (HPC) racks capable of being equipped with multiple individual processor and/or memory modules. Load 202 in the example of FIG. 3 may be a first processor module in the HPC module, and additional load 304 may represent one or more additional processor modules that may be added to the HPC rack. Hardware allocation resource 302, which may be a remotely-located system (network) configuration server, can thus precondition power supply unit 201 for introduction of additional HPC components as described above with reference to FIG. 3.

Figure 4:
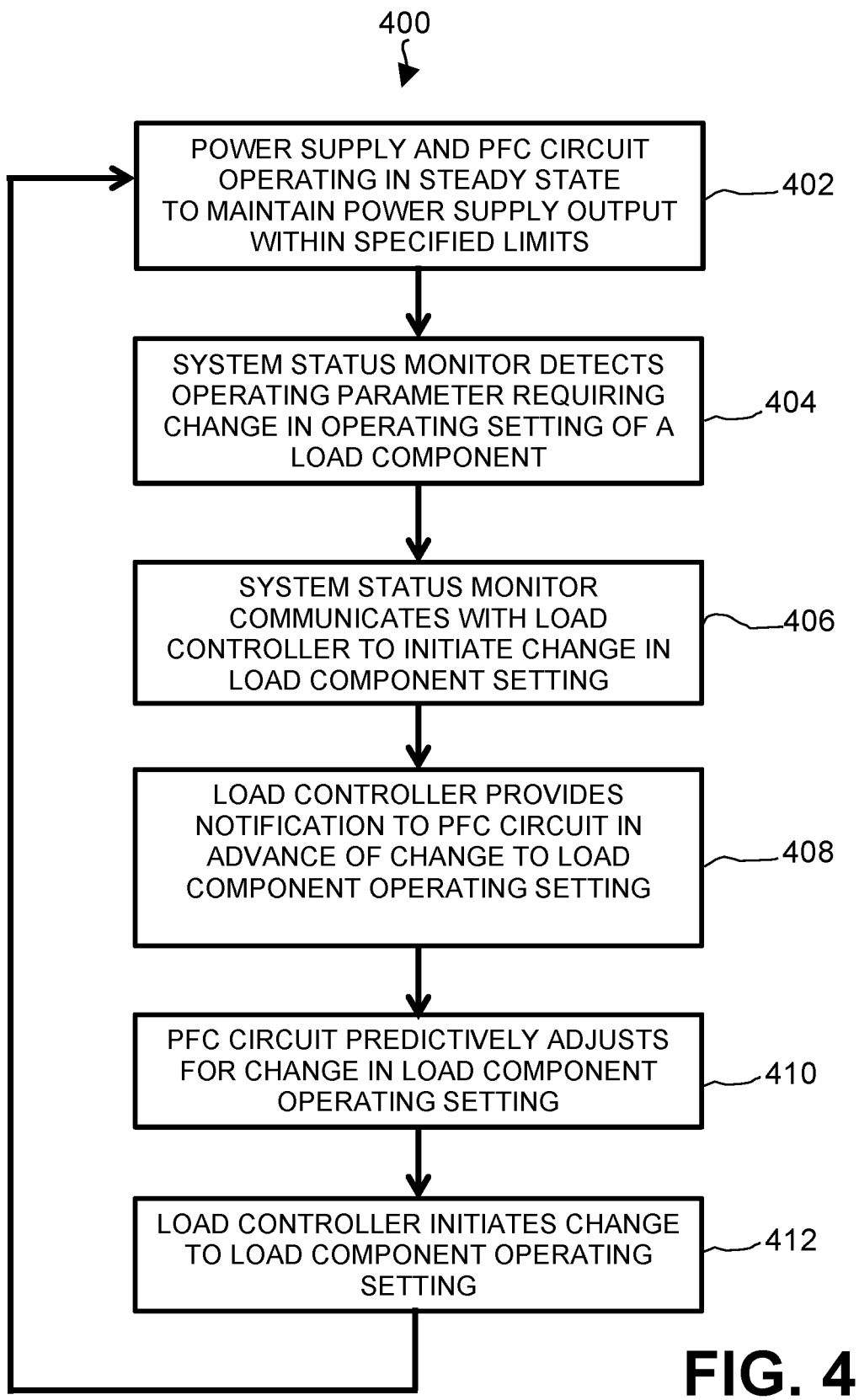
FIG. 4 is a flowchart depicting a method for operating the electronic system of FIG. 2.

FIG. 4 is a flow chart depicting a method 400 for operating an electronic system in accordance with example system 200 from FIG. 2. Operation as shown in FIG. 4, begins with block 402, wherein power supply 204 and PFC circuit 226 are cooperating to maintain power supply output 206 within specified limits, as sensed by power sensor 230.

In block 402, system status monitor 220 determines that one or more operating parameters of a component 210 of load 202 are such that a change in the operating state of a load component 210 is desired. In block 404, system status monitor 220 communicates with load controller 212 to initiate a change in the operating setting of the load component 210.

In block 408, load controller 212 communicates via connection 234 with PFC circuit 226 to provide PFC circuit 226 a pending load change notification in advance of the pending change in the operating state of a load component 210. In block 410, PFC circuit 226 predictively adjusts to the pending load change in the operating state of load component 210. In block 412, load controller 212 initiates the change to the operating state of load component 210. Due to the predictive adjustment of PFC circuit 226, the change in the operating setting of load component 210 in block 412 advantageously has minimal impact on the condition of power supply output 206. Thus, from block 412, operation as depicted in FIG. 4 returns to block 402 in which power supply 204 and PFC circuit 226 cooperate to maintain power supply output 206 within specified limits.

Figure 5:
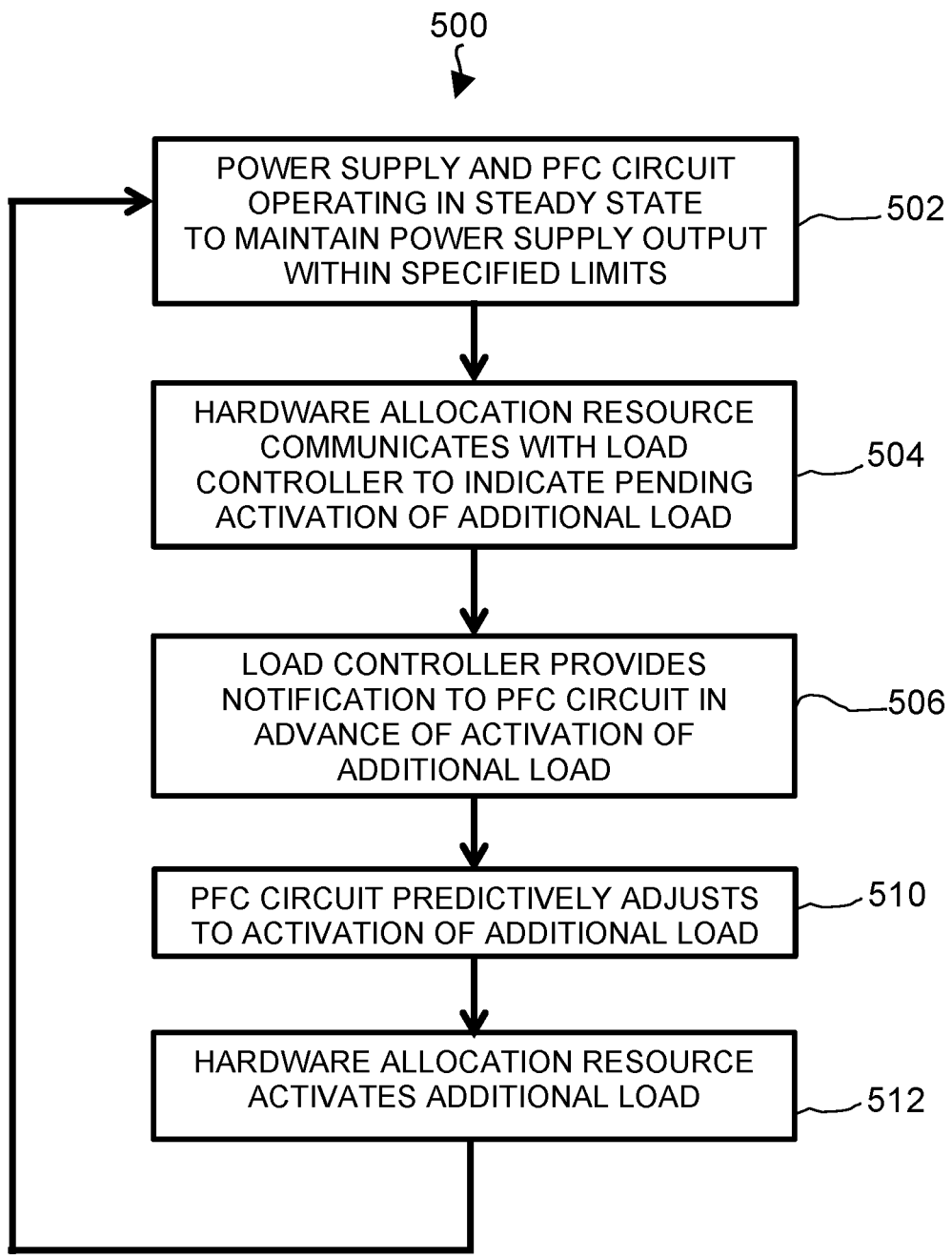
FIG. 5 is a flowchart depicting a method of operating the electronic system of FIG. 3.

FIG. 5 is a flow chart depicting a method 500 for operating an electronic system in accordance with example system 300 from FIG. 3. Operation as depicted in FIG. 5 begins at block 502, wherein power supply unit 201 and PFC circuit 226 are cooperating to maintain power on power supply output 206 within specified operational limits. In block 504, hardware allocation resource 302 notifies load controller 312 via connection 314 that activation of additional load 304 is pending.

In block 506, load controller 312 provides a pending load change notification via connection 234 to PFC circuit 226 in advance of the pending activation of additional load 304. In block 510, PFC circuit predictively adjusts for activation of additional load 304. Then, in block 512, hardware allocation resource 302 causes power coupling circuit 306 to activate additional load 304. Due to the predictive adjustment of PFC circuit 226 in block 510, activation of additional load 304 in block 512 advantageously has minimal impact on the condition of power supply output 206. Thus, from block 512, operation as depicted in FIG. 5 returns to block 502 in which power supply 204 and PFC circuit 226 cooperate to maintain power supply output 206 within specified limits.

In this description, for purposes of explanation, numerous specific details are set forth in order to provide a thorough understanding of the examples disclosed herein. It will be apparent, however, to one skilled in the art that the disclosed example implementations may be practiced without these specific details. In other instances, structure and devices are shown in block diagram form in order to avoid obscuring the disclosed examples. Moreover, the language used in this disclosure has been principally selected for readability and instructional purposes and may not have been selected to delineate or circumscribe the inventive subject matter, resorting to the claims being necessary to determine such inventive subject matter. Reference in the specification to "one example" or to "an example" means that a particular feature, structure, or characteristic described in connection with the examples is included in at least one implementation.

In addition, certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various implementations of the present disclosure. Numerous variations and modifications will become apparent to those skilled in the art once the above disclosure is fully appreciated. It is intended that the following claims be interpreted to embrace all such variations and modifications.

What is claimed is:

1. An electronic system, comprising:
   a load comprising one or more electronic components, the load being variable based on changes in operating states of the electronic components;
   a power supply that provides power to the load;
   a power factor control circuit configured to dynamically adjust a power factor of the power supplied by the power supply;
   an additional load;
   a hardware allocation resource, coupled to the load controller;
   a power coupling circuit, coupled to the hardware allocation resource and responsive to the hardware allocation resource to selectively couple the additional load to the power supply;
   the hardware allocation resource being operable to communicate a notification of a pending connection of the additional load to the power supply; and
   a load controller that is responsive to the notification of the pending connection of the additional load to the power supply to provide a pending load change notification to the power factor control circuit;
   wherein the power factor control circuit is responsive to the pending load change notification to predictively adjust the power factor of the power from the power supply to compensate for a change in the load indicated by the pending load change notification.

2. The electronic system of claim 1, wherein the hardware allocation resource comprises a network configuration server coupled to the load controller and the power coupling circuit by network connections.

3. The electronic system of claim 1, further comprising:
   a system status monitoring circuit, for monitoring at least one status parameter of electronic components in the electronic system and for communicating system status information to the load controller, the load controller being responsive to the system status information to adjust the operating state of the load.

4. The electronic system of claim 3, wherein the load comprises at least one cooling fan for the system, and the operating state of the load comprises the speed of the at least one cooling fan.

5. The electronic system of claim 4, wherein the system status monitoring circuit monitors an operating temperature parameter in the electronic system and provides temperature readings to the load controller.

6. The electronic system of claim 1, further comprising a serial link between the load controller and the power factor control circuit for communicating the pending load change notification from the load controller to the power factor control circuit.

7. A method, comprising:
   providing the electronic system of claim 1,
   coupling a hardware allocation resource to the load controller, the hardware allocation resource operable to selectively couple an additional load to the power supply;
   communicating from the hardware allocation resource to the load controller a pending load change notification prior to connection of the additional load to the power supply;
   causing the controller to determine that the load is going to change, and, in response, provide a pending load change notification to the power factor control circuit;
   communicating the pending load change notification from the load controller to the power factor control circuit prior to the pending connection of the additional load to the power supply; and
   causing the power factor control circuit to, responsive to the pending load change notification, predictively adjust the power factor of the power provided from the power supply to compensate for a change in the load indicated by the pending load change notification such that fluctuation in the power factor of the power from the power supply due to connection of the additional load is minimized.

8. The method of claim 7, wherein coupling the hardware allocation resource to the load controller comprises providing a network connection between a network configuration server and the load controller.

9. The method of claim 7, further comprising:
   monitoring, in a system status monitoring circuit, at least one operating status parameter of electronic components in the electronic system; and
   providing a pending load change notification from the system monitoring circuit to the load controller prior to the pending load change in the operating state of the load.

10. The method of claim 9, wherein the load comprises at least one cooling fan for the system, and the operating state of the load comprises the speed of the at least one cooling fan.

11. The method of claim 10, wherein the at least one operating status parameter of electronic components in the electronic system comprises a temperature parameter.

12. The method of claim 7, further comprising communicating the pending load change notification from the load controller to the power factor control circuit via an inter-integrated circuit link between the load controller and the power factor control circuit.

13. A method for operating a power supply system for an electronic system including a load, comprising:
   coupling a power supply output of a power supply to the load;

coupling a power factor control circuit to the power supply to maintain a power factor of the power supply output within a specified range;

coupling a load controller to the load and to the power factor control circuit, the load controller being operable to select an operating state of the load;

coupling a hardware allocation resource to the load controller, the hardware allocation resource operable to selectively couple an additional load to the power supply;

communicating from the hardware allocation resource to the load controller a pending load change notification prior to connection of the additional load to the power supply;

communicating the pending load change notification from the load controller to the power factor control circuit prior to the pending connection of the additional load to the power supply;

receiving, at the power factor control circuit, the pending load change notification from the load controller prior to the pending connection of the additional load to the power supply;

in response to the pending load change notification, predictively adjusting the power factor, such that fluctuation of the power factor of the power supply output due to connection of the additional load is minimized.

14. The method of claim 13, further comprising:

monitoring at least one operating status parameter of the electronic system and communicating status parameter information to the load controller;

wherein the load controller is responsive to the status parameter information to select an operating state of the load.

15. The method of claim 14, wherein the load comprises at least one cooling fan for the system, and the changing of the operating state of the load comprises changing the speed of the at least one cooling fan.

16. The method of claim 15, wherein the monitoring at least one operating status parameter comprises monitoring an operating temperature parameter.

17. The method of claim 13, further comprising providing an inter-integrated circuit link between the load controller and the power factor control circuit for communicating the pending load change notification from the load controller to the power factor control circuit.

* * * * *